(12) United States Patent
McLaurin

(10) Patent No.: US 7,913,131 B2
(45) Date of Patent: Mar. 22, 2011

(54) SCAN CHAIN CELL WITH DELAY TESTING CAPABILITY

(75) Inventor: Teresa Louise McLaurin, Dripping Springs, TX (US)

(73) Assignee: ARM Limited, Cambridge (GB)

( * ) Notice: Subject to any disclaimer, the term of this patent is extended or adjusted under 35 U.S.C. 154(b) by 588 days.

(21) Appl. No.: 12/007,144

(22) Filed: Jan. 7, 2008

(65) Prior Publication Data

US 2009/0177935 A1 Jul. 9, 2009

(51) Int. Cl.
*G01R 31/28* (2006.01)
(52) U.S. Cl. .......................................... 714/726; 714/731
(58) Field of Classification Search .................. 714/726, 714/729, 727, 731; 327/263
See application file for complete search history.

(56) References Cited

U.S. PATENT DOCUMENTS

| | | | | |
|---|---|---|---|---|
| 5,329,532 A * | 7/1994 | Ikeda et al. | ................... | 714/731 |
| 5,448,575 A * | 9/1995 | Hashizume | .................... | 714/727 |
| 5,715,171 A * | 2/1998 | Mori et al. | ....................... | 716/18 |
| 6,806,731 B2 * | 10/2004 | Kohno | ............................. | 326/38 |
| 7,162,673 B2 * | 1/2007 | Wong | ............................ | 714/726 |
| 2007/0245192 A1 * | 10/2007 | Furuya | .......................... | 714/726 |
| 2007/0262787 A1 * | 11/2007 | Chakraborty et al. | .......... | 326/16 |
| 2009/0125769 A1 * | 5/2009 | Nguyen et al. | ................. | 714/731 |
| 2009/0132882 A1 * | 5/2009 | Chen | ............................. | 714/731 |

OTHER PUBLICATIONS

Savir, J.; , "Scan latch design for delay test," Test Conference, 1997. Proceedings., International , vol., No., pp. 446-453, Nov. 1-6, 1997 doi: 10.1109/TEST.1997.639650.*

Tekumalla, R.; Menon, P.R.; , "Delay-testable non-scan sequential circuits with clock suppression ," Circuits and Systems, 1996. ISCAS '96., 'Connecting the World'., 1996 IEEE International Symposium on , vol. 4, No., pp. 137-140 vol. 4, May 12-15, 1996 doi: 10.1109/ISCAS.1996.541918.*

Vermaak et al., Using the Oscillation Test Method to Test for Delay Faults in Embedded Cores, (2004), pp. 1105-1110.

* cited by examiner

*Primary Examiner* — Cynthia Britt
(74) *Attorney, Agent, or Firm* — Nixon & Vanderhye P.C.

(57) ABSTRACT

A scan chain cell 24 is provided with a built-in delay testing capability. An inverter 32 generates an inverted form of the cell output which is available within the scan chain cell 24 for rapid use in forming a transition at the cell output Q. Clock gating circuitry 36, 38 is responsive to a hold signal to block the functional path 34, 26, 28 through the scan chain cell and hold the output signal when desired. The functional clock clk may be clocked twice at speed to trigger capture of the results of processing the output of the scan chain cell 24 for the non-inverted value followed by the (internally generated) inverted value, i.e. a signal transition. In this way delay testing of the functional circuitry 18 can be performed.

18 Claims, 8 Drawing Sheets

SCAN CHAIN CELL WITH DELAY TESTING CAPABILITY

BACKGROUND OF THE INVENTION

1. Field of the Invention

This invention relates to the field of integrated circuit testing. More particularly, this invention relates to scan chain cells which are used to apply stimulus signals to, and capture result signals from, signal nodes within integrated circuits.

2. Background of the Invention

It is known to provide scan chain cells arranged in serially connected scan chains through which stimulus signal values or result signal values may be serially clocked. This is a convenient way to test complex integrated circuits. As the complexity of integrated circuits increases, they are often formed of a collection of different functional units with some of those functional units being disposed within the integrated circuit such that it is not possible to directly apply signals as inputs to those functional units through an external connection to the device. In these circumstances, scan chain cells are particularly useful for accessing the points (nodes) within an integrated circuit at which it is desired to apply a stimulus signal and from which it is desired to capture a result signal when those points are not otherwise externally accessible.

There is an ongoing progression within integrated circuit design to use increasingly small process sizes. These small process sizes enable higher densities of circuit gates to be achieved, reduce power consumption and increase performance. A drawback with the use of such smaller processes, e.g. 45 nm process sizes and below, is that the variability between individual gates becomes a more significant factor resulting in a lower yield of properly operating integrated circuits. In this context, test, such as manufacturing test, is becoming increasingly significant. One important aspect of integrated circuit performance that needs to be tested is the "at speed" performance to determine that processing logic within the integrated circuit is capable of operating at its design speed or to detect other types of defect that manifest themselves as an excessive delay. One way of viewing this test is that it is necessary to determine that the functional logic is capable of responding to changes in values of input signals sufficiently rapidly to generate the appropriate output signals without too large a delay which would cause an error in operation. This type of testing can be termed "delay testing".

A problem exists in using conventional scan chain cells to apply stimulus signals for such delay testing. Scan chain cells are typically provided in a serially connected fashion and use a scan clock to shift signal values through the scan chain at a comparatively slow speed. Accordingly, changing a signal value at a stimulus node within an integrated circuit from one signal value to another signal value so as to cause a transition and test the delay time through a functional circuit is difficult to achieve by serially advancing differing signal values through the scan chain cell since the scan clock is typically not fast enough, and the gates within the scan cell chain are often made small and weak for area saving and power saving reasons. Even if the scan system is fast enough to shift at speed, there are other reasons why this may be undesirable, e.g. a requirement for a separate scan enable. It may also be undesirable to have to add multiple state holding elements within a wrapper cell to support rapid transition generation.

SUMMARY OF THE INVENTION

Viewed from one aspect the present invention provides an integrated circuit comprising:

a scan chain cell having a functional path used in non-test operation between a functional input and a cell output, said functional path being controlled by a functional clock signal; and functional circuitry clocked by said functional clock signal and coupled to said cell output so as to receive an input signal to be processed by said functional circuitry; wherein said scan chain cell has:

inverting circuitry coupled to said cell output to generate an inverted signal having a value opposite to said input signal;

inverted value selecting circuitry coupled to said inverting circuitry and responsive to a test selecting signal to select said inverted signal as a next signal output from said cell output; and output signal holding circuitry responsive to a hold signal to hold unchanged a signal value at said cell output.

The technique recognises that the scan chain cell itself can generate an appropriate inverted value which is available within the scan chain cell for use as the next signal value to be applied to the functional path thereby generating a transition, the effect of which can be monitored. This combination of mechanisms provides a relatively low overhead way of achieving reliable delay testing of functional circuitry (the circuitry for performing normal non-test operations) with good coverage of potential fault situations which can occur within the integrated circuit. The scan chain cell also provides a signal holding capability whereby a hold signal applied to the scan chain cell will control it to hold its output while the functional clock is toggled. This is useful in sensitizing paths to transitions in other signals.

The output signal holding circuitry may act by gating the action of the functional clock signal within the scan chain cell.

Whilst it will be appreciated that the scan chain cell could be used in a variety of different ways within an integrated circuit to apply the stimulus discussed above, it is particularly suited for use within systems where the scan chain cell is part of a wrapper scan chain providing test access to signal nodes that are not directly accessible from outside the integrated circuit. These nodes may supply their stimulus signal outwardly and/or inwardly (extest and/or intest). Complex integrated circuit designs with large functional blocks, such as processor cores, embedded within them and not directly accessible from the outside are becoming more common and the use of wrapper scan chains to test such functional blocks is an increasingly useful technique, particularly when combined with the delayed testing capability provided by the present technique. The wrapper scan chains can be used to test logic within a core (intest) and also to test logic external of such a core (extest). The methodology applies to both cases.

In order to reduce the control signal overhead associated with the present technique, the testing select signal can be shared by a plurality of scan chain cells, (up to all of the scan chain cells) within a wrapper scan chain. The scan chain cells could however be provided with separate test select signals.

In a similar way, in order to reduce overhead it is possible that the hold signal can be shared by a plurality of scan chain cells (up to all of the scan chain cells) within the wrapper scan chain. Different combinations of shared/non-shared test select and hold signals are possible. Sharing the hold signal reduces the ability to select particular scan chain cells to be held while others toggle in value. The held values can sensitize paths to toggling signals and thus the more the hold signals are shared the less specific can be the sensitization. It is also possible that in some systems it may be desirable to use a plurality of hold signals which are independent from one another so that some of the scan chain cells can be held and the inverted signal used to generate a transition, while other of the scan chain cells are not held in this way. This can be useful in increasing the amount of fault coverage achievable since it may be appropriate to not transition some signal nodes within the design in order to sensitise other functional circuits to the delay test that is to be performed. With a shared hold signal fault coverage may still be increased as a held node may serve to sensitise a node which does not have a scan chain cell as the head state element of its path and so is not being held.

In some embodiments of the scan chain cell, the scan path between a scan in port and the cell output can be controlled by a separate scan clock signal and this clock signal may also be gated by the clock gating circuitry in response to the hold signal. The gating of the scan clock signal in this way is useful for holding the scan chain cell in the desired state to perform delay testing irrespective of other signals and manipulations which may be being performed using the scan clock signal.

Whilst it will be appreciated that the present technique is not dependant upon the relative speed of the scan path and the functional path (e.g. it can be used to avoid the need to provide multiple state holding elements within the scan cells in order to support rapid transition generation), it does have particular use when the scan path is slower than the functional path as in the circumstances the use of the scan path to generate transitions for delay testing is difficult. However, the technique can still be used when the scan path is capable of operating at full speed, e.g. as a way of avoiding the need for separate scan enables to the wrapper.

Whilst the inverting value selecting circuitry can take a wide variety of different forms, one form that may be conveniently used is that of a multiplexer switched by the test selecting circuitry.

It will also be appreciated that the clock gating circuitry can take a wide variety of different forms depending on the particular implementation of the scan chain cell. One convenient form is the use of one or more OR gates logically combining the functional clock signal with the hold signal. It will be appreciated that other forms of clock gating circuitry are also possible.

Viewed from another aspect the present invention provides an integrated circuit comprising:

scan chain cell means having a functional path used in non-test operation between a functional input and a cell output, said functional path being controlled by a functional clock signal; and functional circuit means clocked by said functional clock signal and coupled to said cell output so as to receive an input signal to be processed by said functional circuit means; wherein said scan chain cell means has:

inverting means coupled to said cell output for generating an inverted signal having a value opposite to said input signal;

inverted value selecting means coupled to said inverting circuitry and responsive to a test selecting signal for selecting said inverted signal as a next signal output from said cell output; and output signal holding means responsive to a hold signal for holding unchanged a signal value at said cell output.

Viewed from a further aspect the present invention provides a scan chain cell for coupling via a cell output to functional circuitry clocked by a functional clock signal, said scan chain cell comprising:

a functional path used in non-test operation between a functional input and said cell output, said functional path being controlled by said functional clock signal;

inverting circuitry coupled to said cell output to generate an inverted signal having a value opposite to said input signal;

inverted value selecting circuitry coupled to said inverting circuitry and responsive to a test selecting signal to selected said inverted signal as a next signal output from said cell output; and output signal holding circuitry responsive to a hold signal to hold unchanged a signal value at said cell output.

Viewed from a further aspect the present invention provides a method of testing an integrated circuit with a scan chain cell, said method comprising the steps of:

controlling with a functional clock signal a functional path used in non-test operation through said scan chain cell between a functional input and a cell output;

controlling with a scan clock signal a scan path through said scan chain cell between a scan input and said cell output;

receiving and processing an input signal from said cell output with functional circuitry clocked by said functional clock signal;

generating within said scan chain cell an inverted signal having a value opposite to said input signal;

in response to a test selecting signal, selecting within said scan chain cell said inverted signal as a next signal output from said cell output; and in response to a hold signal, holding unchanged a signal value at said cell output.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
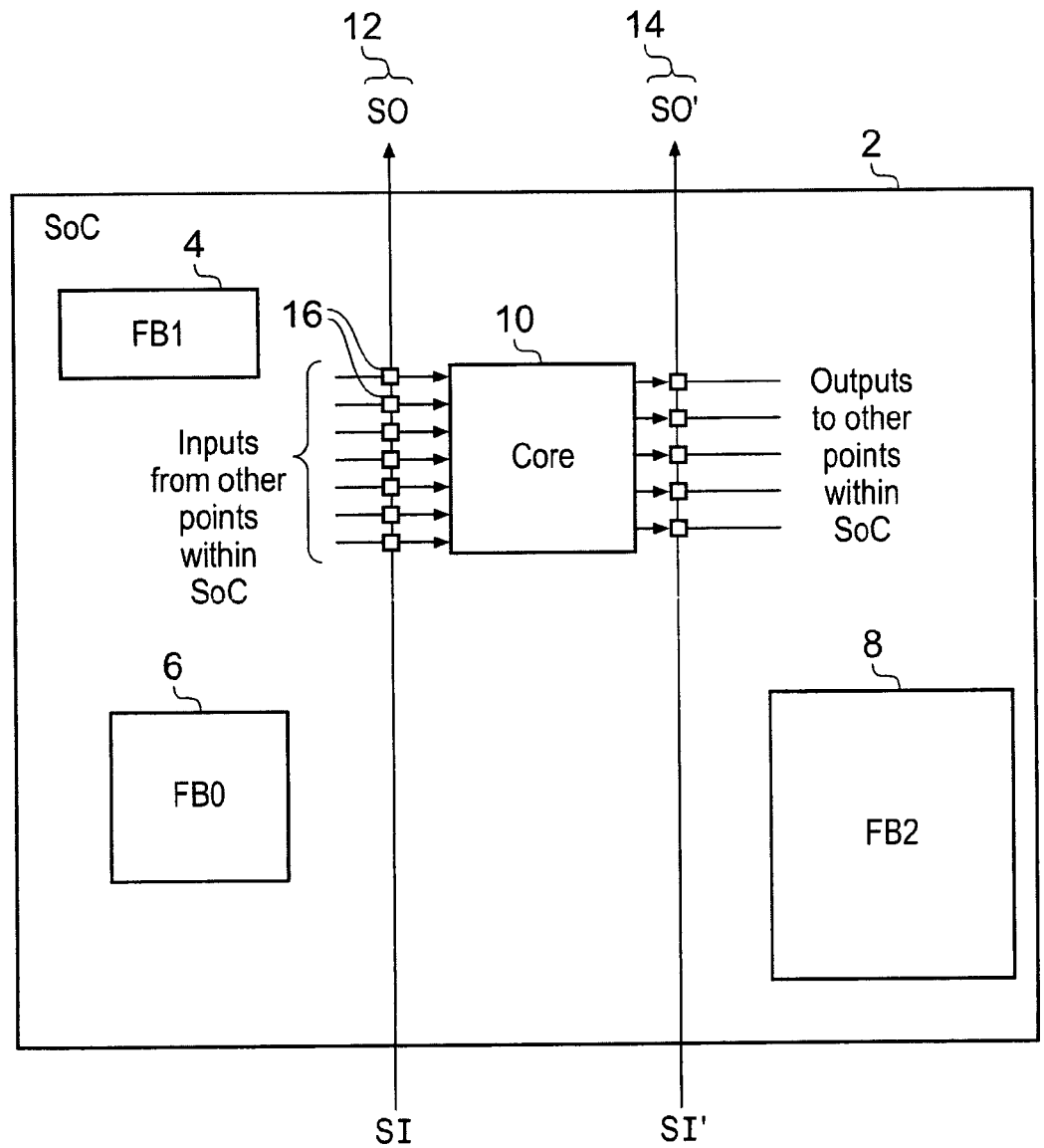
FIG. 1 schematically illustrates an integrated circuit using wrapper scan chains.

FIG. 1 schematically illustrates an integrated circuit 2 in the form of a system-on-chip integrated circuit. This integrated circuit 2 includes a plurality of functional blocks 4, 6, 8, 10. These functional blocks 4, 6, 8, 10 can take a wide variety of different forms and may be produced using designs from a variety of different companies. As an example, the functional block 8 may be a memory designed by one company with the functional block 10 being a processor core designed by another company.

In FIG. 1 the functional block 10 in the form of a processor core has associated wrapper scan chains 12 and 14 for respectively applying stimulus signals to the core 10 and capturing result signals from the core 10. In this example it will be seen that separate wrapper scan chains 12 and 14 are provided for inputs and outputs, but it will be appreciated that many other different configurations are possible and the wrapper scan chains 12 and 14 could be combined in the form of a single wrapper scan chain. It will be noted that, as indicated in FIG. 1, the input signals from the wrapper scan chain 12, and the output signals from the wrapper scan chain 14, link to other points within the system-on-chip integrated circuit 2 and are not directly connected to the exterior of the integrated circuit 2. The scan chain cells 16 can be used to test both the core 10 and external logic directly connected to the core 10. For this reason, it is not possible to directly apply at speed signal transitions to these points by using a transition in an externally applied signal. The individual scan chain cells 16 which are serially connected to provide the wrapper scan chains 12, 14 are illsuited to generating such at speed transitions by serially advancing different signal values between the scan chain cells 16.

It will be appreciated that the processor core 10 will itself comprise many functional circuits which can be subject to delay testing in accordance with the present techniques. The present techniques are not restricted to the testing of any particular type of functional block or functional circuit within a functional block.

Figure 2:
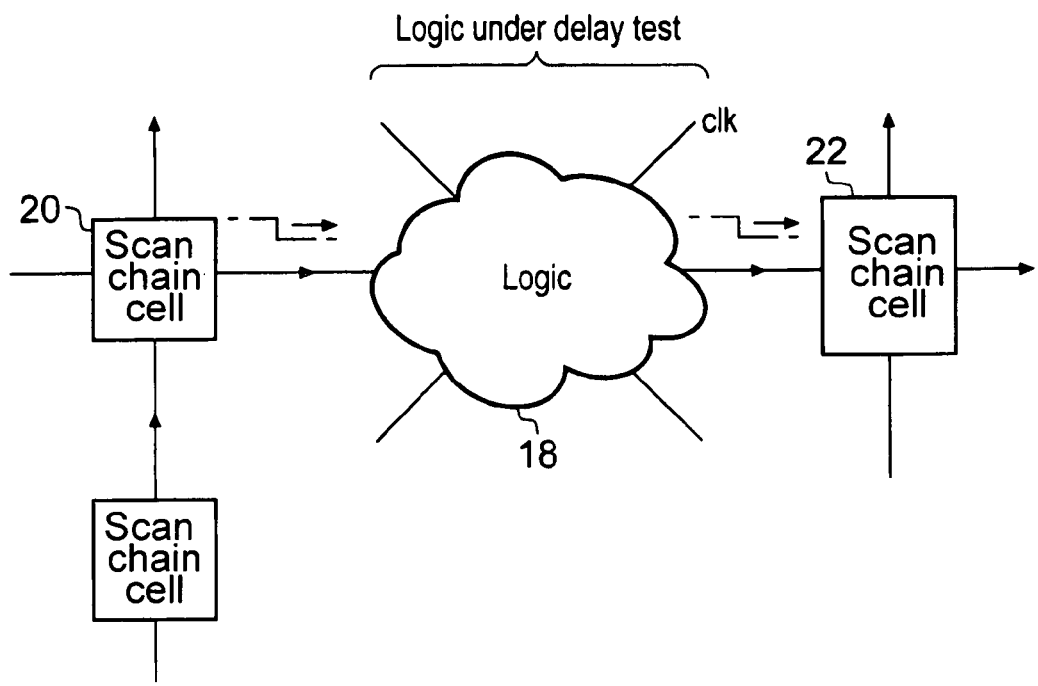
FIG. 2 schematically illustrates the use of scan chain cells to apply a signal transition to functional circuitry so as to delay test that functional circuitry.

FIG. 2 schematically illustrates a functional circuit 18 which is to be subject to delay testing. A scan chain cell 20, which is part of a wrapper scan chain 12, 14, is used to apply a signal transition to one of the inputs of the functional circuit 18. The functional circuit 18 responds to this signal transition and performs its processing so as to generate an output signal that may also transition when the functional circuit 18 is operating correctly. This output signal value is captured in a further scan chain cell 22. The capture time of the scan chain cell 22 can be adjusted and accordingly the time taken for the transition to occur in the output signal of the functional circuit 18 can be determined by sampling the output at various different delay times starting from the transition in the input signal. In this way, a determination can be made as to the processing delay associated with the functional circuit 18 and its correct operation can be verified. Such delay testing may be performed as part of manufacturing test may be performed as part of design testing or both. It will be seen that the functional circuit 18 responds to a functional clock signal clk in order to perform its signal processing.

Figure 3:
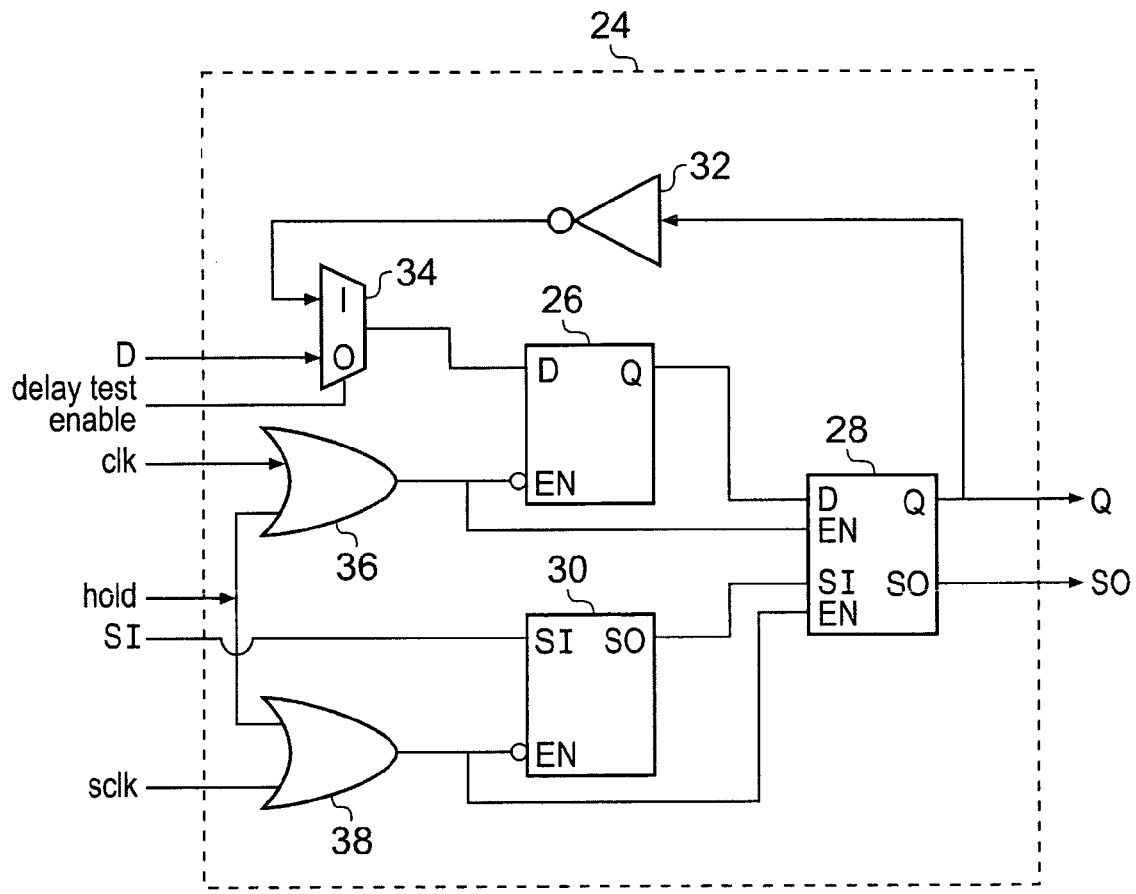
FIG. 3 schematically illustrates a scan chain cell with an in-built delay testing capability in accordance with one example embodiment of the present technique.

FIG. 3 illustrates a scan chain cell 24 having an in-built delay testing capability. The scan chain cell includes three latch elements 26, 28, 30 that together form a functional signal latch 26, 28 and a scan latch 30, 28. The functional signal latch 26, 28 is provided by the combination of the latch elements 26 and 28 with the functional path through this functional latch 26, 28 being between the D input signal and the Q output signal. The latch elements 26, 28 forming the functional latch are clocked by the functional clock signal clk so as to permit a functional signal to propagate therethrough and be held therein. The latch elements 30, 28 together provide a scan chain latch 30, 28. This scan chain latch 30, 28 is part of a serial scan chain and has a serial input SI and a serial output SO. A scan clock signal sclk controls advancing of the serial signals through the scan chain latch 30, 28 and holding of wrapper scan chain signals within the scan chain latch 30, 28.

Also provided within the scan chain cell 24 is an inverter 32 which inverts the output signal on the cell output Q to generate an inverted signal which is supplied to a multiplexer 34. The inverter 32 performs the role of the inverted circuitry discussed above and the multiplexer 34 performs the role of the inverting value selecting circuitry discussed above. This is only one example of the ways in which these circuit elements may be provided. The output from the inverter 32 is selectively applied as the input to the functional latch 26, 28 as a replacement for the functional input signal D when such behaviour if selected by a delay test enable signal. The delay test enable signal in this example provides the test selecting signal described above.

Two OR gates 36, 38 serve to respectively gate the functional clock signal clk and the scan signal sclk under control of a hold signal. The OR gates 36, 38 provide the clock gating circuitry discussed above in this example embodiment.

Figure 4:
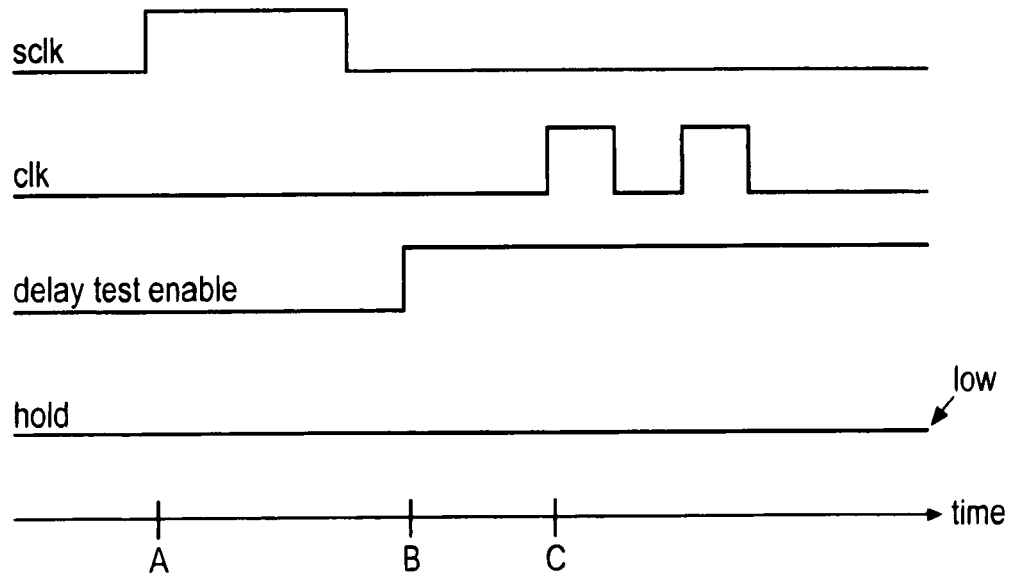
FIG. 4 is a signal timing diagram illustrating the relative timing of various signals controlling the operation of the scan chain cell of FIG. 3 when performing delay testing.

FIG. 4 is a signal timing diagram illustrating the values of different signals controlling the operation of the scan chain cell 24 when performing delay testing. In this example the scan clock sclk and the functional clock clk are separate, but in other possible designs (e.g. muxD) the clock could be shared for both functions. This is one example of how such delay testing may be controlled.

The use of a shared hold signal may increase fault coverage by virtue of the held nodes serving to sensitise other nodes which do not have any other scan chain cell and so are not being held. FIG. 4 illustrates various timing points as the delay testing operation progresses and these are respectively marked A, B, C, D, and E. The state and operation of the scan chain cell 24 at these different times A, B, C, D and E will be discussed in relation to FIGS. 5-9.

Figure 5:
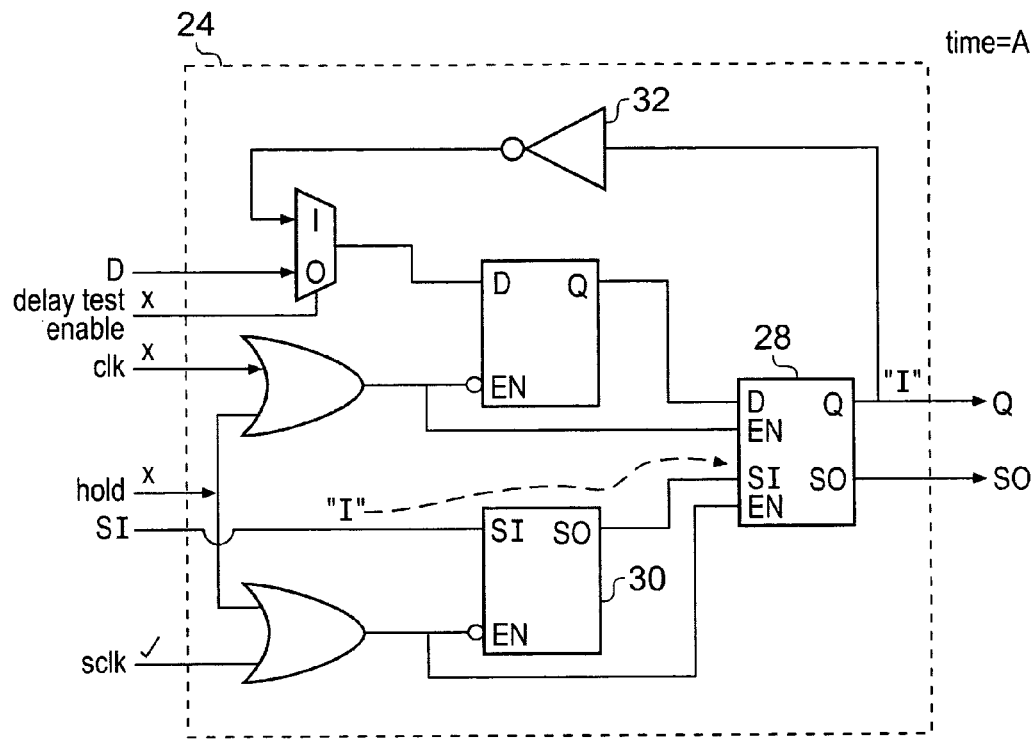
FIGS. 5-7 illustrate the scan chain cell of FIG. 3 at various times during signal transition generation for delay testing.

FIG. 5 illustrates the operation of the scan chain cell 24 at time A. At this time the scan clock signal sclk is asserted, the hold signal is not asserted and a scan chain input signal SI, being in this example a "1" value, propagates through the latch elements 30, 28 and is applied at the cell output Q.

Figure 6:
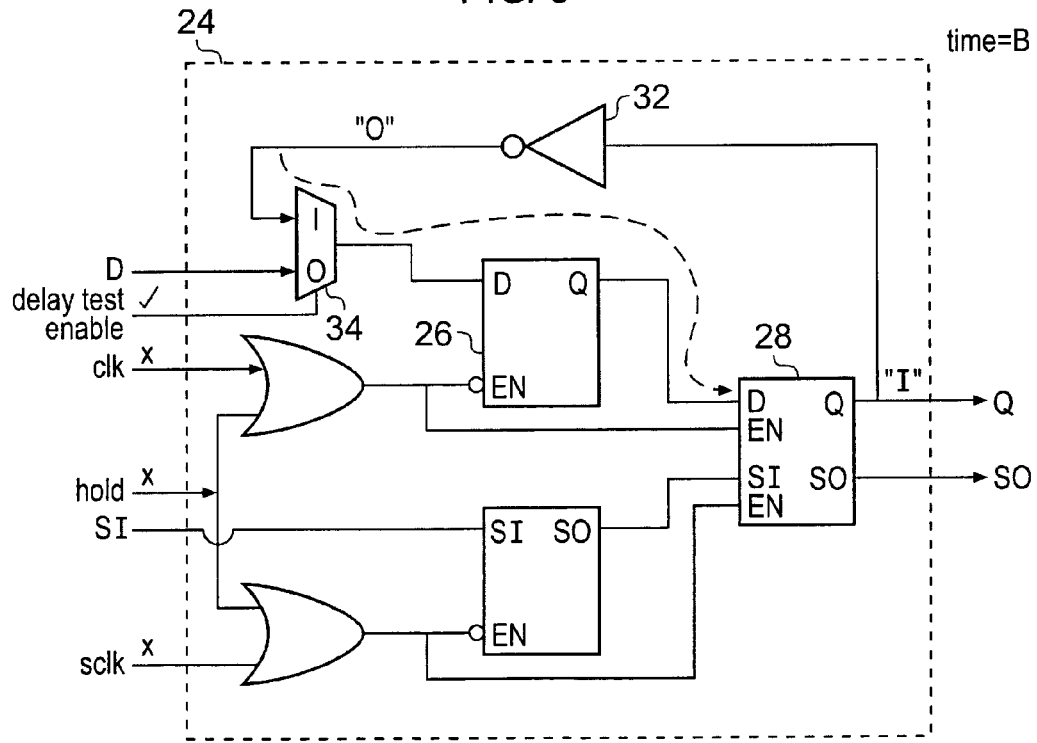

FIG. 6 illustrates the operation of the scan chain cell 24 at time B. At this time, the delay test enable signal switches the multiplexer 34 to select the output of the inverter 32 to be fed back into the functional latch 26, 28. As this inverted signal generated by the inverter 32 is generated within the scan chain cell 34 itself it can be made more rapidly available and is held ready within the functional latch 26, 28 to be applied to the cell output Q in place of the currently driven output signal "1" at the next functional clock. The inverter 32 need not be within a library cell, but it would be faster provided that way. Also the wrapper cell can comprise more than one library element.

Figure 7:
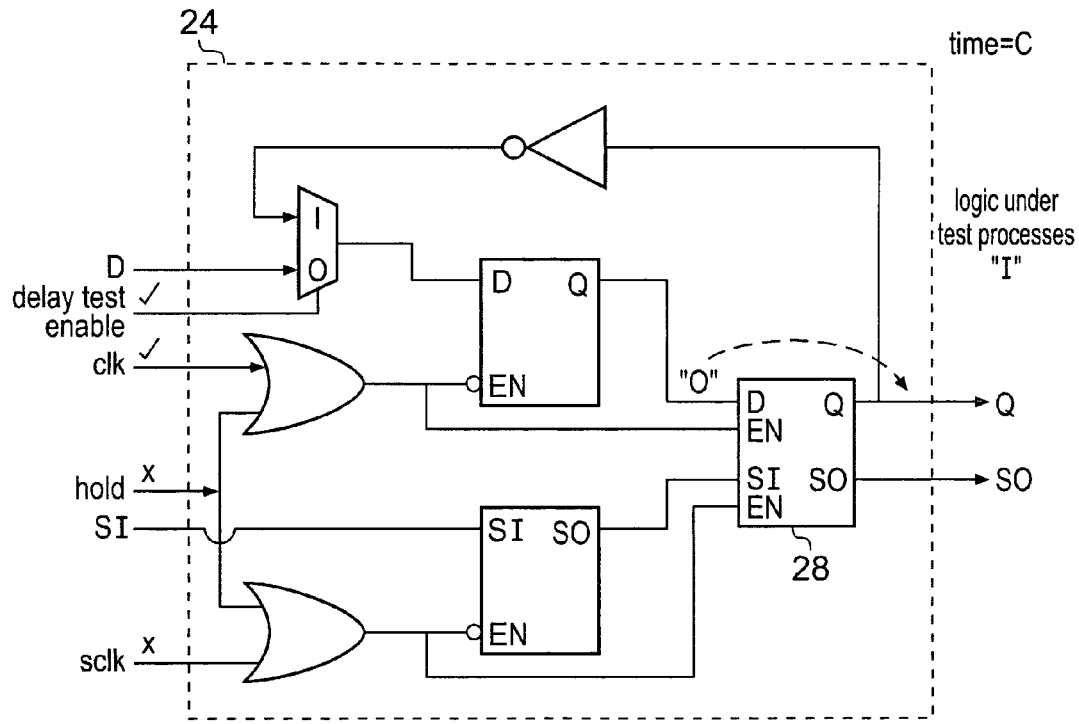

FIG. 7 illustrates the operation of the scan chain cell 24 at time C. At this time the functional clock signal clk is asserted. This triggers capture in scan chain cell 22 of the output of the functional circuit 18, which is to be subject to delay test, and that has resulted from the processing of the signal value "1". At the same time, the latch element 28 is opened so as to permit the inverted signal "0" to appear at the cell output Q and to start the processing of the "0" signal value by the functional circuit 18. The propagation delays through the latch element 28 and through the functional circuitry 18 are such that the value captured in scan chain cell 22 at time C with not be influenced by the "0" thereby avoiding a false result. The next functional clock signal clk pulse illustrated in FIG. 4 will cause capture of the result of the processing of the inverted value "0". This tests a "1" to "0" transition and whether the result of this transition propagates through the functional circuitry within the functional clock period. The generation of the inverted value within the scan chain cell 24 itself permits this next functional clock signal to be applied "at speed" with an assured signal transition in the scan chain cell 24 output Q.

Figure 8:
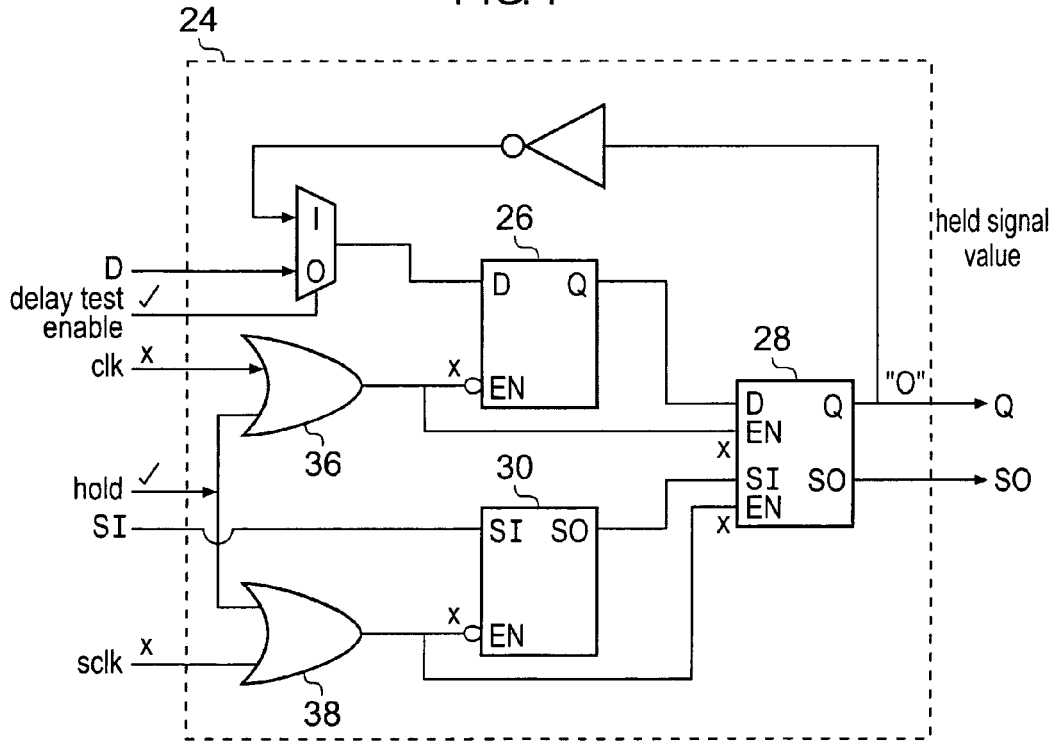
FIGS. 8 and 9 illustrate the scan chain cell of FIG. 3 being used to hold a signal value output while a functional clock signal is advanced.

FIG. 8 illustrates the operation of the scan chain cell 24 when acting to hold a signal output. At this time a hold signal is asserted. This hold signal acts with the OR gates 36,38 to gate the functional clock signal clk and the scan clock signal sclk such that both the functional path through latch elements 26, 28 is blocked as well as the scan path between latch elements 30 and 28. The scan chain cell 24 thus holds its output, in this case a value of "0".

Figure 9:
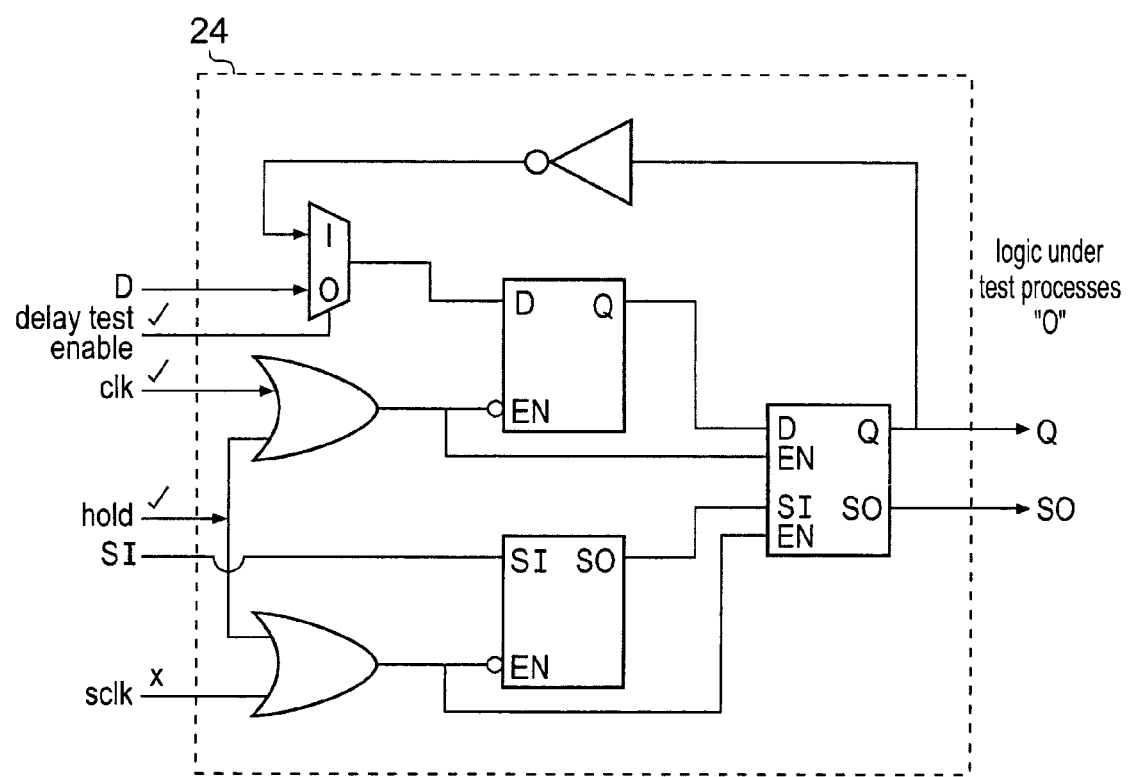

FIG. 9 illustrates the operation of the scan chain cell 24 when the functional clock clk is asserted while the hold signal is active. In this case the functional path 26, 28 and the scan path 30, 28 are both blocked. The functional clock signal nevertheless triggers capture of the processing results from the functional circuitry 18. Thus, a known constant signal value, e.g. "0", is applied to the functional circuitry 18 while the functional clock signal clk is advanced. This can be useful in sensitizing paths for test.

In one scenario separate hold signals can be provided to the wrapper scan chain cells at respective different inputs to some functional circuitry under test so that one of these inputs may be held constant while the other is transitioned. The constant value may be needed to sensitize the functional circuitry being tested.

In another scenario the functional circuitry may have some input(s) which is not supplied via wrapper scan chain cells and cannot be held at a fixed value. In this scenario, one or more input signals which do pass through wrapper scan chain cell can be held constant, potentially to sensitize the circuitry to test the delay associated with the input signal(s) that is not held.

Figure 10:
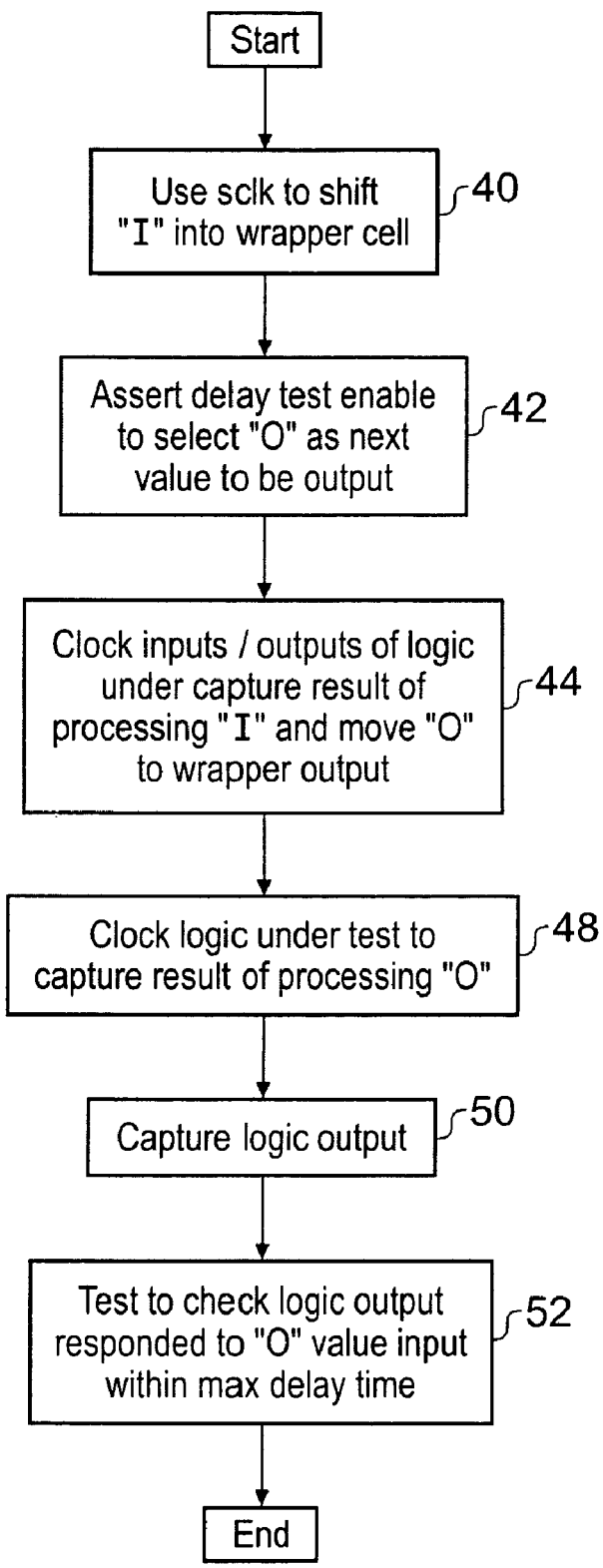
FIG. 10 is a flow diagram schematically illustrating a delay testing methodology in accordance with the present techniques.

FIG. 10 is a flow diagram schematically illustrating delay testing in accordance with one example of the present technique. At step 40 the scan clock signal is used to shift a known signal value "1" into a wrapper cell. At step 42 the delay test enable signal is asserted and an inverted signal value "0" is selected and made available within the scan chain cell 24 for use as the next value to the output there from. This inverted signal value is generated within the scan chain cell 24 itself (in this example by the inverter 32); the inverter 32 need not be within the same library cell. The hold signal remains low throughout as the scan chain cell is being used to generate a transitioning value rather than a held value.

At step 44, the result of the processing by the functional circuitry 18 of the signal value "1" is captured. The functional clock clk at this time also serves to move the inverted signal value "0" to the cell output Q and the functional circuitry 18 starts to respond to this new signal value "0" (i.e. responds to a "1" to "0").

At step 48 the functional clock clk is clocked again so as to trigger capture at the output of the functional circuitry 18 of the result of processing the inverted signal "0" which was presented at the cell output Q. This second functional clock signal clk follows "at speed" since the inverted signal value was generated within the scan chain cell (which can comprise more than one library cell) itself and so is rapidly available.

At step 50 the output of the functional circuitry 18 in response to the transition of its input signal value is captured. Step 52 then determines the functional circuitry 18 responded to the transition in the relevant input signal value within a maximum permitted delay time. It will be appreciated that the step 52 will typically be performed off-chip once the observe signal value has been recovered and may be analysed with the appropriate testing tools and software.

Figure 11:
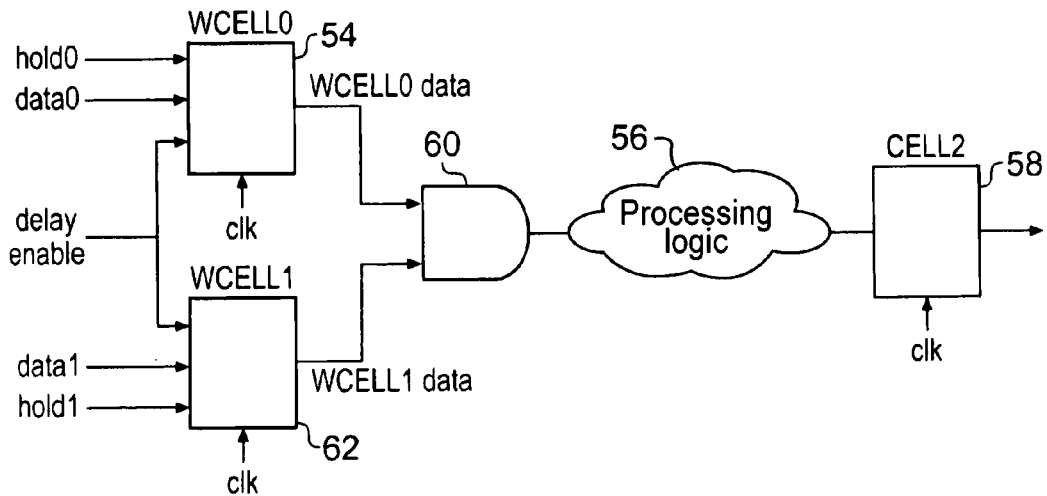
FIG. 11 schematically illustrates the use of two wrapper scan chain cells with separate hold signals.

FIG. 11 schematically illustrates the use of two wrapper scan chain cells with separate hold signals. It is desired to test the signal path extending between wrapper cell 54 through processing logic 56 to a further cell 58. As part of this path to be tested there is a gate 60 which receives an input from a wrapper scan chain cell 62 that must have a predetermined value if the path under test is to be unblocked. This gate is schematically illustrated in FIG. 11 as an AND gate. It will be appreciated that the arrangement of the gate 60 and the processing logic 56 is schematic and illustrative of what in practice may be a much more complicated arrangement. At an overall level the desired operation is that the wrapper scan chain cell 62 should hold a value at its output which allows the path under test to be unblocked while the wrapper scan chain cell 54 generates an at-speed signal level transition which propagates through the gate 60 and the processing logic 56 to cell 58 where it is captured. In this way the path delay can be tested.

Figure 12:
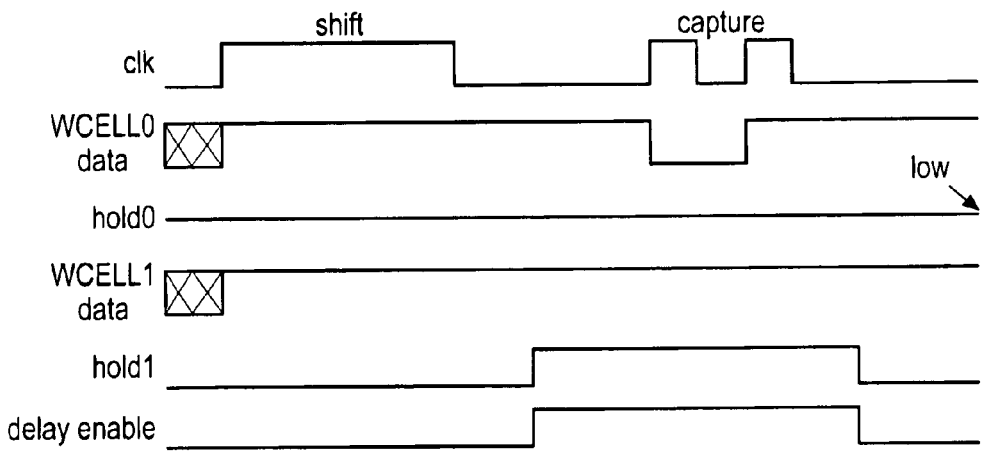
FIG. 12 is a signal timing diagram for use in understanding a mode of use of the arrangement of FIG. 11.

FIG. 12 is a signal timing diagram illustrating control and data signals which arise in the above scenario when performing path delay testing. It will be noted that the wrapper scan chain cell 54 has a hold signal hold0 and the wrapper scan chain cell 62 has a separate hold signal hold1. During a shift in phase of operation the clock signal is controlled so as to serially scan in desired values into the wrapper scan chain cells 54, 62 in accordance with conventional serial scan chain operation. In this example, high values "1" are scanned into both of the wrapper scan chain cells 54, 62. When these data values are in place, the hold signal hold1 of wrapper scan chain cell 62 is asserted and the delay_enable signal is asserted in order to activate the delay testing mode for the wrapper scan chain cell 54. When the clock signal clk is then advanced as previously described the wrapper scan chain cell 54 will generate a transition at its output and the processing result from that output can be captured within the cell 58 following the normal clock period delay in order to determine whether the path delay time through the processing logic 56 and the gate 60 is too long. During this operation the output of the wrapper scan chain cell 54 will toggle with each rising edge of the clock signals clk since its whole signal hold0 is not asserted. In contrast, as the hold signal hold1 for the wrapper scan chain cell 62 is asserted, its output will remain constant and accordingly the signal path through the gate 60 will remain open and the circuitry accordingly sensitised for the delay testing of the path through gate 60 and processing logic 56. Use of separate hold signals in this way allows particular processing paths to be sensitised for delay testing and accordingly, test coverage may be increased.

Figure 13:
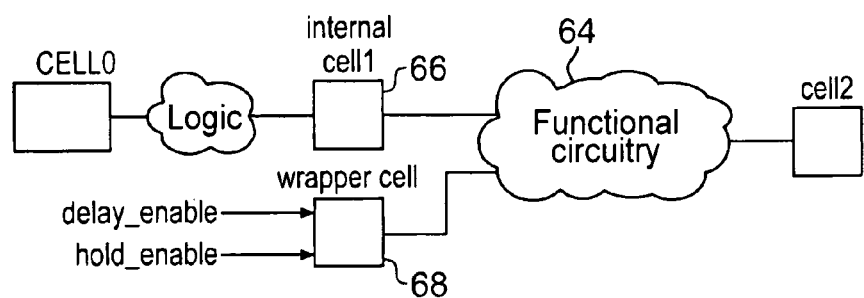
FIG. 13 schematically illustrates another possible use of the wrapper scan chain cell.

FIG. 13 shows functional circuitry 64 with one input signal coming from an internal cell 66 which is not part of the wrapper and cannot be controlled by wrapper control signals. Another input signal to the functional circuitry 64 comes from a wrapper cell 68 which can be controlled to output and hold (during functional clock clk clocking) a known signal value thereby sensitizing the functional circuitry 64 to the delay associated with the transitions in the signal from the internal cell 66.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. An integrated circuit comprising:
   a scan chain cell having a functional path used in non-test operation between a functional input and a cell output, said functional path being controlled by a functional clock signal; and
   functional circuitry clocked by said functional clock signal and coupled to said cell output so as to receive an input signal to be processed by said functional circuitry; wherein said scan chain cell has:
   inverting circuitry coupled to said cell output to generate an inverted signal having a value opposite to said input signal;
   inverted value selecting circuitry coupled to said inverting circuitry and responsive to a test selecting signal to select said inverted signal as a next signal output from said cell output; and
   output signal holding circuitry responsive to a hold signal to hold unchanged a signal value at said cell output, wherein said scan chain cell is part of a wrapper scan chain providing test access to signal nodes within said integrated circuit that are not directly accessible from outside said integrated circuit, wherein said test selecting signal is shared by a plurality of scan chain cells within said wrapper scan chain.

2. An integrated circuit as claimed in claim 1, wherein said output signal holding circuitry comprises clock gating circuitry responsive to a hold signal to block said functional path while permitting said functional circuitry to receive and process said inverted signal.

3. An integrated circuit as claimed in claim 2, wherein
   said scan chain cell has a scan path between a scan input and said cell output, said scan path being controlled by a scan clock signal; and
   said clock gating circuitry is responsive to said hold signal to block said scan path.

4. An integrated circuit as claimed in claim 3, wherein said scan path has a greater propagation delay than said functional path.

5. An integrated circuit as claimed in claim 2, wherein said clock gating circuitry comprises one or more OR gates logically combining said functional clock signal with said hold signal.

6. An integrated circuit as claimed in claim 1, wherein inverted value selecting circuitry comprises a multiplexer switched by said test selecting signal.

7. An integrated circuit comprising:
   a scan chain cell having a functional path used in non-test operation between a functional input and a cell output, said functional path being controlled by a functional clock signal; and
   functional circuitry clocked by said functional clock signal and coupled to said cell output so as to receive an input signal to be processed by said functional circuitry; wherein
   said scan chain cell has:
   inverting circuitry coupled to said cell output to generate an inverted signal having a value opposite to said input signal;
   inverted value selecting circuitry coupled to said inverting circuitry and responsive to a test selecting signal to select said inverted signal as a next signal output from said cell output; and
   output signal holding circuitry responsive to a hold signal to hold unchanged a signal value at said cell output, wherein said scan chain cell is part of a wrapper scan chain providing test access to signal nodes within said integrated circuit that are not directly accessible from outside said integrated circuit, wherein said hold signal is shared by a plurality of scan chain cells within said wrapper scan chain.

8. An integrated circuit as claimed in claim 7, wherein said plurality of scan chain cells within said wrapper scan chain form different sets of scan chain cells each having a respective different independent hold signal to controlling blocking of functional paths through said set of scan chain cells.

9. An integrated circuit comprising:
   scan chain cell means for applying stimulus signals to a signal node within said integrated circuit, said scan chain cell means having a functional path used in non-test operation between a functional input and a cell output, said functional path being controlled by a functional clock signal; and
   functional circuit means for providing a circuit function, said functional circuit means is clocked by said functional clock signal and coupled to said cell output so as to receive an input signal to be processed by said functional circuit means; wherein
   said scan chain cell means has:
   inverting means, coupled to said cell output, for generating an inverted signal having a value opposite to said input signal;
   inverted value selecting means, coupled to said inverting circuitry and responsive to a test selecting signal, for selecting said inverted signal as a next signal output from said cell output; and
   output signal holding means, responsive to a hold signal, for holding unchanged a signal value at said cell output, wherein said scan chain cell means is part of a wrapper scan chain means for providing test access to signal nodes within said integrated circuit that are not directly accessible from outside said integrated circuit, wherein said test selecting signal is shared by a plurality of scan chain cell means within said wrapper scan chain means.

10. A method of testing an integrated circuit with a scan chain cell, said method comprising the steps of:
    controlling with a functional clock signal a functional path used in non-test operation through said scan chain cell between a functional input and a cell output;
    controlling with a scan clock signal a scan path through said scan chain cell between a scan input and said cell output;
    receiving and processing an input signal from said cell output with functional circuitry clocked by said functional clock signal;
    generating within said scan chain cell an inverted signal having a value opposite to said input signal;
    in response to a test selecting signal, selecting within said scan chain cell said inverted signal as a next signal output from said cell output; and
    in response to a hold signal, holding unchanged a signal value at said cell output, wherein said scan chain cell is part of a wrapper scan chain providing test access to signal nodes within said integrated circuit that are not directly accessible from outside said integrated circuit, wherein said test selecting signal is shared by a plurality of scan chain cells within said wrapper scan chain.

11. A method as claimed in claim 10, comprising in response to said hold signal, blocking within said scan chain cell said functional path while permitting said functional circuitry to receive and process said inverted signal.

12. A method as claimed in claim 11, wherein said step of blocking is performed by one or more OR gates logically combining said functional clock signal with said hold signal.

13. A method as claimed in claim 10, further comprising:
controlling with a scan clock signal a scan path through said scan chain cell between a scan input and said cell output; and
in response to said hold signal blocking said scan path.

14. A method as claimed in claim 13, wherein said scan path has a greater propagation delay than said functional path.

15. A method as claimed in claim 10, wherein said step of selecting is performed by a multiplexer switched by said test selecting signal.

16. A method of testing an integrated circuit with a scan chain cell, said method comprising the steps of:
controlling with a functional clock signal a functional path used in non-test operation through said scan chain cell between a functional input and a cell output;
controlling with a scan clock signal a scan path through said scan chain cell between a scan input and said cell output;
receiving and processing an input signal from said cell output with functional circuitry clocked by said functional clock signal;
generating within said scan chain cell an inverted signal having a value opposite to said input signal;
in response to a test selecting signal, selecting within said scan chain cell said inverted signal as a next signal output from said cell output; and
in response to a hold signal, holding unchanged a signal value at said cell output, wherein said scan chain cell is part of a wrapper scan chain providing test access to signal nodes within said integrated circuit that are not directly accessible from outside said integrated circuit, wherein said hold signal is shared by a plurality of scan chain cells within said wrapper scan chain.

17. A method as claimed in claim 16, wherein said plurality of scan chain cells within said wrapper scan chain form different sets of scan chain cells each having a respective different independent hold signal to controlling blocking of functional paths through said set of scan chain cells.

18. An integrated circuit comprising:
scan chain cell means for applying stimulus signals to a signal node within said integrated circuit, said scan chain cell means having a functional path used in non-test operation between a functional input and a cell output, said functional path being controlled by a functional clock signal; and
functional circuit means for providing a circuit function, said functional circuit means is clocked by said functional clock signal and coupled to said cell output so as to receive an input signal to be processed by said functional circuit means; wherein
said scan chain cell means has:
inverting means, coupled to said cell output, for generating an inverted signal having a value opposite to said input signal;
inverted value selecting means, coupled to said inverting circuitry and responsive to a test selecting signal, for selecting said inverted signal as a next signal output from said cell output; and
output signal holding means, responsive to a hold signal, for holding unchanged a signal value at said cell output, wherein said scan chain cell means is part of a wrapper scan chain means for providing test access to signal nodes within said integrated circuit that are not directly accessible from outside said integrated circuit, wherein said hold signal is shared by a plurality of scan chain cell means within said wrapper scan chain means.

* * * * *